United States Patent [19]

Charransol et al.

[11] Patent Number: 4,644,382
[45] Date of Patent: Feb. 17, 1987

[54] PREDIFFUSED INTEGRATED CIRCUIT AND A METHOD OF INTERCONNECTION OF THE CELLS OF SAID CIRCUIT

[75] Inventors: Pierre Charransol; Jean C. Audrix; Claude Athenes, all of Colombes, France

[73] Assignee: Thomson-CSF Telephone, Colombes, France

[21] Appl. No.: 820,895

[22] Filed: Jan. 17, 1986

Related U.S. Application Data

[63] Continuation of Ser. No. 477,850, Mar. 22, 1983, abandoned.

[30] Foreign Application Priority Data

Mar. 26, 1982 [FR] France ................... 82 05245

[51] Int. Cl.$^4$ .................... H01L 29/78; H01L 27/04
[52] U.S. Cl. ........................ 357/42; 357/40; 357/45
[58] Field of Search .................... 357/40, 41, 42, 45

[56] References Cited

U.S. PATENT DOCUMENTS 3,943,551 3/1976 Skorup .................. 357/42
4,249,193 2/1981 Balyoz et al. .......... 357/40
4,412,237 10/1983 Matsumura et al. ...... 357/42

FOREIGN PATENT DOCUMENTS 1141869 2/1983 Canada .
0001209 4/1979 European Pat. Off. ...... 357/71

OTHER PUBLICATIONS

Noto et al.; I.E.E.E. Circuits and Systems Magazine; vol. 3; No. 3; 9-1981; pp. 14-18.

Primary Examiner—William D. Larkins
Attorney, Agent, or Firm—Cushman, Darby & Cushman

[57] ABSTRACT

A prediffused integrated circuit having rows of basic cells on a substrate. Each basic cell includes two MOS transistors connected in series through a common drain or source electrode, each transistor having a separate gate. All basic cells in a row are the same type while adjacent rows alternate between p-type and n-type.

5 Claims, 14 Drawing Figures

| Fig. 11a |
|----------|
| Fig. 11b |
| Fig. 11c |

PREDIFFUSED INTEGRATED CIRCUIT AND A METHOD OF INTERCONNECTION OF THE CELLS OF SAID CIRCUIT

This is a continuation of application Ser. No. 477,850, filed Mar. 22, 1983, which was abandoned upon the filing hereof.

BACKGROUND OF THE INVENTION

This invention relates to prediffused integrated circuits in which a network of identical cells is prepared beforehand, said cells being subsequently interconnected on demand for carrying out desired logic functions. The invention is also concerned with methods for interconnecting the integrated circuit cells.

The initial technique for the fabrication of integrated circuits consists in utilizing a desired logic circuit and in transposing the logic functions of said circuit to an array of interconnected transistors so as to form an elementary cell. These cells are subsequently interconnected in order to perform the logic function of the desired circuit.

This method, developed for elementary gates, has proved to be impracticable when the degree of complexity of the logic function to be integrated becomes excessive. Very-large-scale integrated circuits in use at the present time in fact contain tens of thousands of transistors. It can therefore be readily understood that the length of time required in order to implant this large number of transistors as well as their corresponding connecting leads is wholly prohibitive.

Interest has therefore focused on systems based on computer-assisted designs involving the use of standardized cells stored in the library of a computer system. Interconnection of said cells may be carried out, at least with assistance, by means of wiring algorithms processed by a computer.

Two techniques based on this principle are in current use. Their advantages and disadvantages are complementary.

The so-called standard cell technique consists in utilizing a library of relatively complex logic functions placed on the available surface of a substrate while taking into account the necessary interconnections between them. Position-location of the cells takes the interconnection into account and conversely, the maximum substrate area available for integration can thus be utilized by placing the cells and the interconnections with maximum packing density. On the other hand, each integrated circuit is completely specific, thus entailing the need for a complete set of masks which is specific to said circuit in order to permit fabrication. Any modification which proves necessary during development of the circuit is thus liable to affect all the masks which in that case have to be re-made in their entirety. Similarly, in order to obtain a modified circuit, the entire fabrication process has to be begun again after the masks have been modified, which thus takes a relatively considerable length of time. The gain in substrate surface area is thus offset by a loss of production time.

The other technique, known as the prediffused network technique, consists in constructing very simple arrays of cells all identical with each other and aligned in a series of rows separated by free spaces of predetermined width.

The logic function to be integrated is implemented in a final step of the fabrication process by deposition of a network of aluminum connecting leads through a mask which is specific to the desired logic function. As will be readily understood, this network of interconnections must conform to the topological limits established by the arrangement of rows of prediffused cells. Since the space allowed for the interconnections is necessarily limited, this leads to saturation of the passages reserved for the connecting leads in the event of even slight complexity of the function to be integrated. Under those conditions, there remain unused cells which cannot be connected and the net result is a loss of useful surface area of the substrate. Conversely, there is a gain in speed of execution by virtue of the fact that it is no longer necessary to provide more than two or three specific masks and that the fabrication of the circuit calls only for deposition of an aluminum interconnection grid on a substrate comprising all the cells, which is the easiest and fastest step of the fabrication process. The long and difficult steps have been performed beforehand at the time of mass production of the prediffused networks which can be made available from stock.

BRIEF SUMMARY OF THE INVENTION

In order to reconcile the advantages of these two methods and to circumvent their disadvantages, the invention proposes a prediffused integrated circuit of the type comprising rows of basic cells on a substrate, a distinctive feature of the invention being the fact that said rows succeed each other in a continuous manner and cover the entire surface of the substrate. According to the present invention, a prediffused integrated circuit comprises rows of basic cells on a substrate. Each basic cell includes two MOS transistors connected in series through a common drain or source electrode, with each transistor having a separate gate. All transistors in a given row are of the same type, but successive rows alternate in type. Thus, one row includes all P-type transistors while adjacent rows are all N-type transistors.

BRIEF DESCRIPTION OF THE DRAWINGS

Other features of the invention will be more apparent upon consideration of the following description and accompanying drawings, wherein.

DETAILED DESCRIPTION OF THE INVENTION

Figure 1:
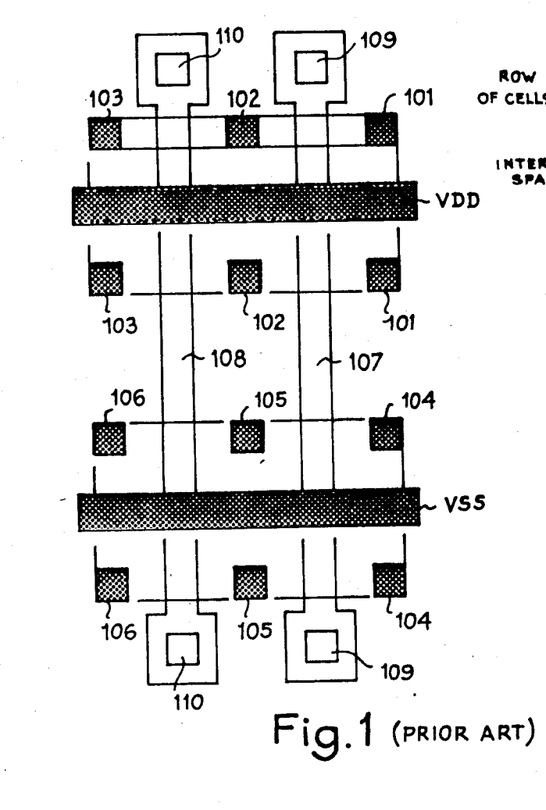
FIG. 1 is a diagram showing a basic cell of the prior art.

The basic cell of a prediffused circuit which is illustrated in FIG. 1 is composed of four MOS transistors connected in series and in pairs. The two upper MOS transistors are p-type transistors in series. The drain and source electrodes of these transistors are accessible at points which are grouped together in pairs. Thus the source of the right-hand transistor is accessible via the points 101, the drain of the same transistor which is common with the source of the left-hand transistor is accessible via the points 102, and the drain of the left-hand transistor is accessible via the points 103. In fact, these transistors are symmetrical and the designation of drain and source as used in this context is wholly conventional since the electrode will be either a drain or a source according to its utilization in the final circuit.

Similarly the transistors of the lower pair are n-type transistors in series, in which the source of the right-hand transistor is accessible via the points 104, the drain of said transistor and the source of the left-hand transistor (which are common) are accessible via the points 105, and the drain of the left-hand transistor is accessible via the points 106.

Each of these transistors has a gate, and said gates are connected together so that the gate 107 is common to the right-hand p-type and n-type transistors and the gate 108 is common to the left-hand p-type and n-type transistors. The gate 107 is accessible via two points 109 located at the top and at the bottom and the gate 108 is accessible via two points 110 which are located in the same manner.

This double distribution of the points of access to the different transistor electrodes is intended to facilitate interconnection of said transistors as well as interconnection of the cells.

The voltages VDD and VSS are supplied respectively to the p-type transistors and the n-type transistors by means of two buses extending through the cells respectively between the points of access to the drains and to the sources of the p-type transistors and the points of access to the drains and to the sources of the n-type transistors.

Figure 2:
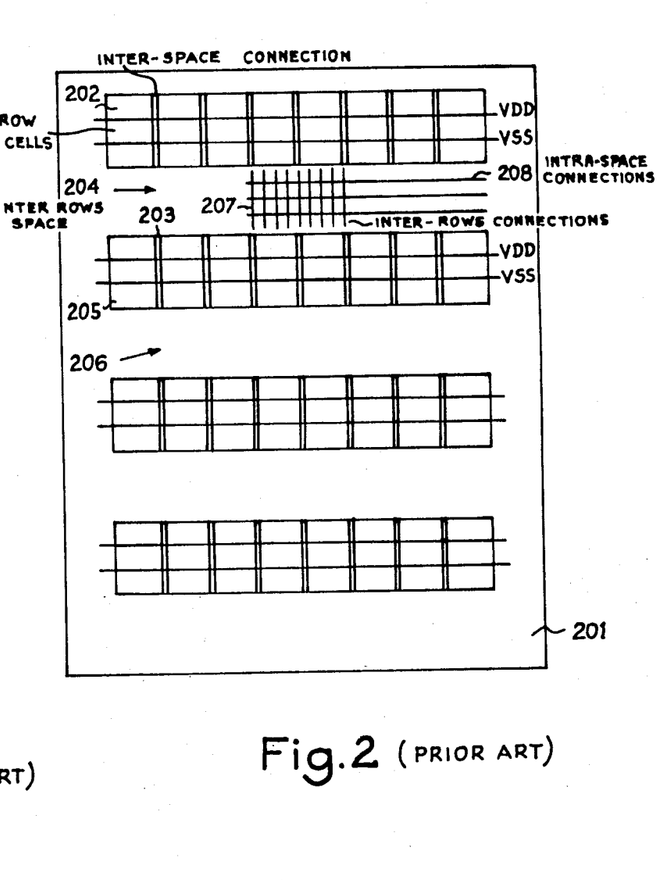
FIG. 2 is a diagram of implantation of a prediffused circuit in accordance with the prior art.

In order to fabricate the basic prediffused circuit for subsequently depositing on said circuit the interconnection grid which is necessary for implementing the desired logic functions, rows of cells such as the rows 202 and 205 are deposited on a substrate 201 shown in FIG. 2. The cells of these rows are usually separated by a space 203 in which is passed lead for providing a connection between, for example, the space 204 which separates the row 202 from the row 205 and the space 206 located between the row 205 and the following row. Said cells are usually formed during the step which involves fabrication of the gates 107 and 108, that is to say by deposition of polycrystalline silicon.

A series of inter-row connections such as those designated by the reference 207 are also formed during the same fabrication step and will be left in readiness for subsequent formation of the vertical connections.

The logic function corresponding to the integrated circuit to be obtained is realized by providing connections between the different transistors of the different cells. This interconnection operation is preferably carried out from one transistor to the next, first by interconnecting the transistors of the same cell and then by connecting the transistors of a number of adjacent cells by means of leads which do not extend beyond the row of cells. The elementary logic functions which can thus be obtained are limited in number and one of these functions is shown by way of example in FIG. 3, namely a two-input NAND-type gate.

Figure 3:
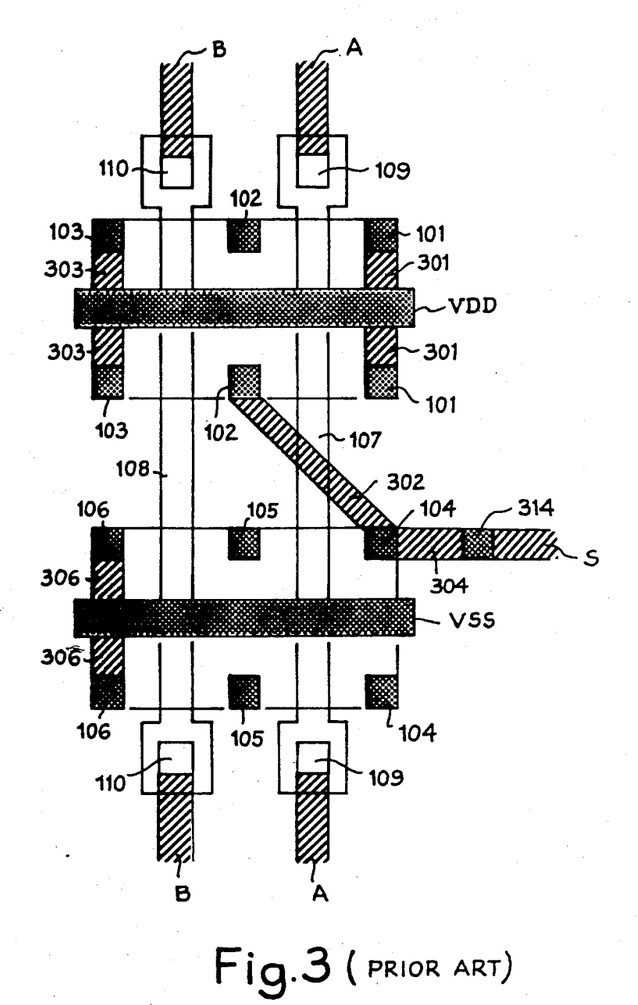
FIG. 3 is a diagram of the cell of FIG. 1, said cell being connected so as to form a logic gate.

To this end, the two p-type transistors are supplied in parallel from the supply bus VDD via the metallizations 301 and 303 which are connected respectively to the connection holes 101 and 103 of the drains of the two transistors. In this case the electrode which is common to these two transistors performs the function of a source and is connected via the bottom hole 102 to a metallization 302 which connects said electrode to the source of the right-hand n-transistor via the top hole 104. In this case the two n-type transistors are employed in series and their common connection is therefore not connected to any external circuit. On the other hand, the drain of the left-hand n-type transistor is connected to the supply bus VSS via a metallization 306 which connects the holes 106 to said bus VSS. The supply circuit of the NAND cell is thus established.

The two input logic states are applied to the gates 107 and 108 via the top holes 109 and 110 by means of two connecting leads A and B. As can readily be understood, these two logic states are again present on the bottom holes 109 and 110 of the gates and can be available, for example, for the purpose of being applied to another gate by means of other leads A and B which are connected to said bottom holes.

The output logic state S of the gate is available on the connecting lead 302 and also on the bottom holes 102 and 104. In the example shown, this logic state is applied to a connecting lead 304. Said lead extends to the cell which is adjacent to the cell shown on its right and which is coupled via a hole 314 to a vertical connection between cells.

Consideration being given in particular to the obstacle represented by the crossing of the supply buses VDD and VSS, it is apparent that a very limited number of logic functions can be performed by means of connections which are wholly internal to the row of cells. In practice, use is essentially made of connections which are internal to each cell and accordingly make it possible to provide only inverters and NAND-gates or NOR-gates. In order to proceed further, it is necessary to pass beyond the connections into the inter-row spaces 204. But only basic logic circuits can really be contemplated in such a case and this again forms part of the general interconnection of gates of the network. It is of course possible to perform any logic function solely by means of inverters, NAND-gates and NOR-gates but the wiring immediately becomes much more bulky and takes up more space than would be the case with more complex functions such as basic logic circuits.

In order to establish this interconnection of cells within the inter-row spaces such as the space 204, connections 208 which are parallel to the buses VDD and VSS are established so as to extend along a certain number of predetermined axes within the inter-row spaces. In the case of those connections which are immediately adjacent to the rows, said connections can be joined to the output points of the gates such as 109 and 110 and of the sources and drains such as those designated by the reference numerals 101 to 106 directly by means of metallic leads which are integral with said connections 208. In the case of the other connections, unless those which may separate them from the rows of cells are interrupted at the point of passage towards the appropriate cell, it is necessary to pass through the inter-row connections 207 which are buried beneath the insulating layer which separates the final metallization from the remainder of the circuit. The necessary holes are then formed in said insulating layer in the process step which precedes metallization.

In consequence, when the different interconnections are determined, fabrication of the integrated circuit accordingly consists in starting from a prediffused circuit covered with its protective oxide layer and, in an initial operation, in piercing the holes which provide a communication with the drains, the sources, the gates, and the buried inter-row and inter-space connections. In a second step a metallization deposit of aluminum is formed so as to interconnect these different holes in accordance with the desired arrangement.

Taking into account the various limitations which have been set forth in the foregoing, it is apparent that an increasing number of cells serve no useful purpose beyond a certain degree of complexity. Thus in the case of prediffused networks of small size in which it is possible to design the interconnection by hand, it is considered that a packing density of 80% is satisfactory. However satisfactory this value may be, it nevertheless represents 20% of loss of the surface area of the substrate. As soon as it becomes necessary to adopt an automatic routing device above a certain size, the packing density is substantially reduced and rapidly falls to 50% or even less, which is a very poor result.

In accordance with the invention, in order to provide a sufficient space between the rows of cells irrespective of the number of connections to be passed through, the initial expedient consists in suppressing the inter-row spaces such as 204 by placing these rows in succession without making provision for any particular space between them. In order to establish the necessary connections between two rows of cells, current is supplied to these two rows but not to the row located between them. This unsupplied row remains covered with its oxide layer on which aluminum connections can be deposited since they will not be disturbed by the unsupplied cells located beneath. If the space thus obtained is not sufficient, a second row of cells is also unsupplied, thus enlarging the space and making it possible to accommodate all the necessary connections. If so required, it remains wholly feasible to enlarge the space even further by increasing the number of unsupplied rows.

This method relies on the assumption that the method adopted for interconnection involves the use of two aluminum layers separated by one insulating layer since buried polycrystalline connections such as the connection 207 are no longer available for carrying out lead crossings.

Figure 4:
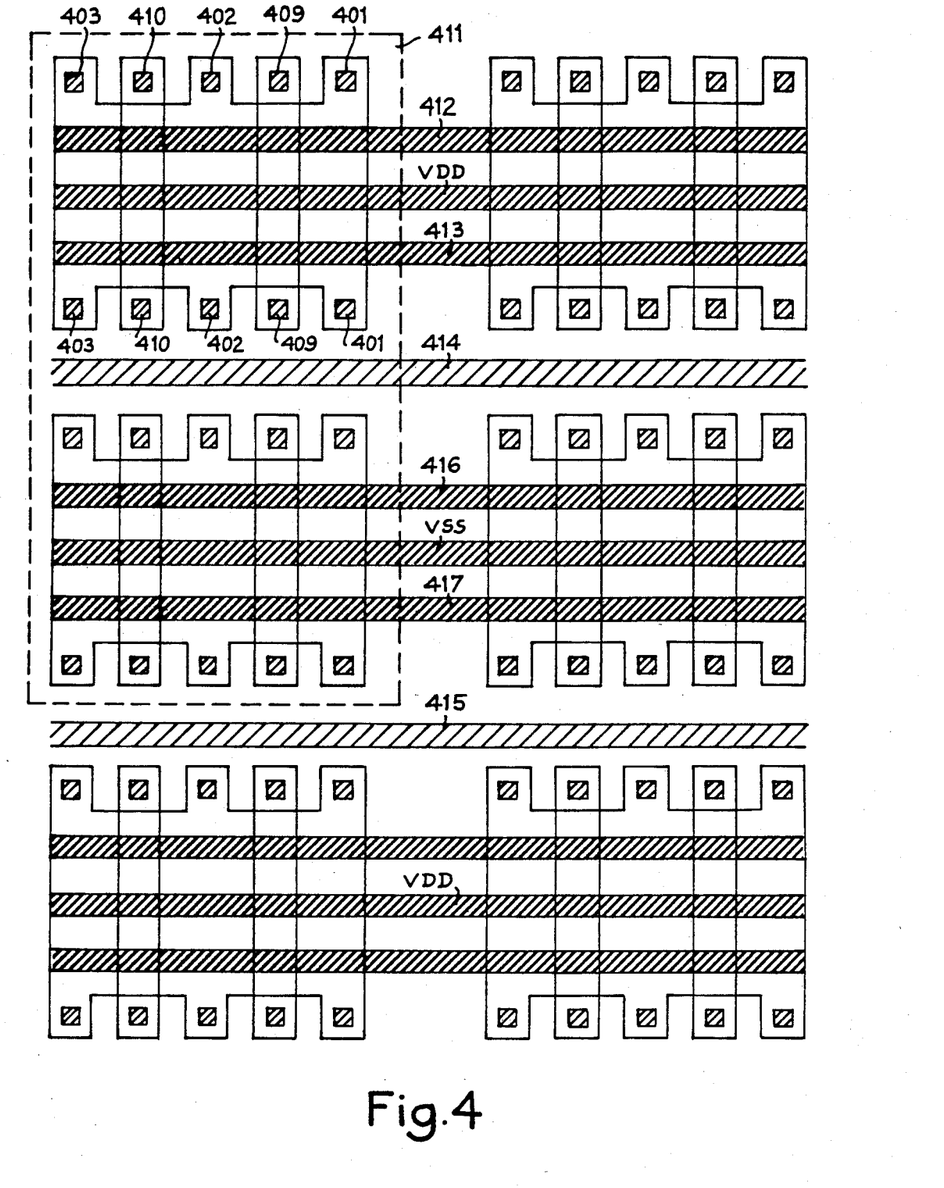
FIG. 4 is a diagram of six adjacent basic cells in accordance with the invention.

More specifically, there is shown in FIG. 4 part of the surface of a prediffused circuit of this type in which provision is made for six cells forming part of three successive rows.

In order to facilitate interconnection in this structure, the basic cells employed actually correspond to half-cells with respect to those of FIGS. 1 and 3. In fact, the successive rows are alternately p-type and n-type and the gates of the transistors of a p-row are not connected to the gates of the transistors of the following n-row. Under these conditions, the two basic cells enclosed within the dashed-outline block 411 correspond to the complete cell of FIGS. 1 and 3.

Furthermore, in order to pass the connections within the cells with greater ease, the output points of the sources and of the drains have been displaced to the same level as the output points of the gates. In consequence, the output points 401, 402 and 403 are located in excrescences of the areas corresponding to the drains and to the sources.

By means of the surface area thus freed, it is possible not only to run one supply connection VDD or VSS longitudinally between said output points but to run still another two connections 412 and 413 longitudinally between the output points mentioned above. These connections are shown in the figure as being continuous but it will be understood that only the fraction required for establishing a connection between two or more successive points is deposited in practice.

Moreover, provision is made in this structure for a small inter-row space for running a connection such as 414 between the top row and the intermediate row or 415 between the intermediate row and the bottom row. Under these conditions, if power is not supplied to the intermediate row, the location of the VSS supply bus is available for making the interconnections. Accordingly, and taking into account the other two interconnection lines 416 and 417 which are internal to said row, there are obtained with the lines 414 and 415 five lines which are available for interconnection. This corresponds to a wholly common value in prediffused circuits.

Should the available space prove insufficient, however, power is not supplied to the bottom row, thus making available four additional interconnection lines and even a further number if the same procedure is continued.

In order to carry out interconnections in the vertical direction, a method entailing the use of a double metallic layer is adopted as stated earlier. In accordance with this method, once the interconnections have been established by means of the lines described in the foregoing, an insulating layer such as silicon oxide, for example, is deposited on the circuit, followed by a series of vertical interconnection lines which are crossed with the horizontal interconnections and make it possible to form all the intersections.

In the example illustrated in the figure, provision is also made between the successive cells of one and the same row for a space substantially equal in width to the space existing between the successive rows. This accordingly makes it possible to place a vertical connection passing between two cells in order to establish an interconnection between the horizontal connections located above a row and the horizontal connections located beneath said row.

In order to make such connections across a row, it is also possible to use a cell which will not be supplied with current and to employ in this case the two gates of the cell as well as the three sources or drains by reason of the fact that these electrodes have connection points at the top and bottom of the cell and that, when said cell is not supplied, they are all isolated from each other. It is also possible in this case to pass metal connections from the second aluminum layer vertically above said unsupplied cell. This possibility should nevertheless be avoided. The same remark applies to the possibility which consists in running connections above the output points of the cells in the case of the unsupplied rows on account of the fact that, if the connections are passed over said output points, the differences in thickness are numerous as well as substantial and that the aluminum layer is readily embrittled in these locations.

By comparing the two cells contained within the dashed rectangle 411 with the electrically corresponding cell of FIG. 1, it is observed that a given pair of basic cells in the circuit according to the invention provides a considerably greater number of possibilities of interconnections than is the case within the same pair of basic cells corresponding to the known cell of the prior art. These possibilities are renewed over the entire length of the two n-type and p-type rows corresponding to a single row of FIG. 2 as formed by the cells of FIG. 1.

It accordingly becomes possible to utilize these interconnections for the realization of a library of standard circuits comprising a large number of logic functions extending well beyond the simple NAND and NOR gates of the prediffused circuits which were already known in the prior art. These standard circuits offer an advantage in that they have dimensions which are multiples of each other and can be inscribed within pairs of rows of basic cells.

Under these conditions, if the possibilities of interconnection between the rows described in the foregoing are utilized in addition, then in that case the methods of placing and routing which have already demonstrated their effectiveness in standard circuits can be utilized in a prediffused circuit structure. In other words, recourse is had to the standard circuits which correspond to the desired logic circuits of the library and which are placed in the rows, whereupon the routing program is employed for defining the interconnections between these rows. It is known that these routing programs can be 100% effective, with the result that the method of fabrication of integrated circuits in accordance with the invention offers not only the advantages of standardization of prediffused circuits but also the advantages of effectiveness both in design and in utilization of the substrate surface of standard circuits.

As in the case of standard circuits, the library can be very considerable. By way of example, there will now be described the structure of a relatively simple two-input NAND-type circuit and a much more complex circuit of the static D-flip-flop type.

Figure 5:
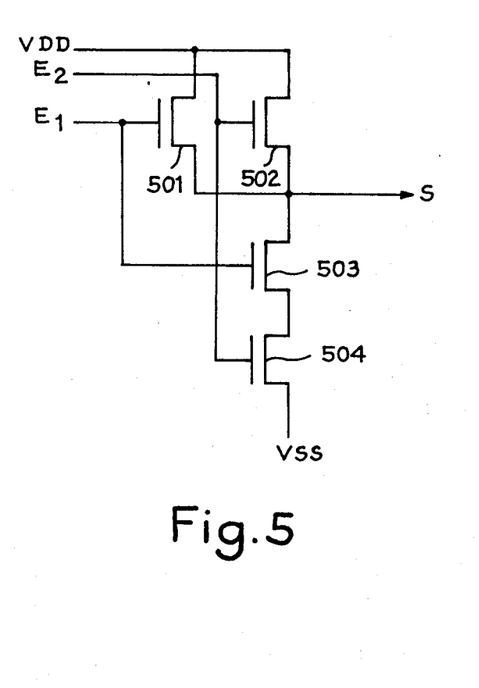
FIG. 5 is a diagram of a NAND-gate.

The schematic circuit diagram of a two-input NAND-gate is shown in FIG. 5. This circuit comprises two p-type MOS transistors 501 and 502 supplied in parallel from a source VDD. These two transistors in parallel are connected in series with two n-type MOS transistors 503 and 504, the second transistor being connected to the supply source VSS. One of the inputs E1 is connected in parallel to the gates of the transistors 501 and 503 and the other input E2 is connected in parallel to the gates of the transistors 502 and 504. The output S of the gate is brought out from the connection which is common to the drains of the transistors 501 and 502 and to the source of the transistor 503.

This very simple circuit is formed by two basic cells of the type shown in FIG. 4 and will now be described in greater detail in order to gain a more complete understanding of the constructional arrangements.

This circuit is constructed by making use of two p-type and n-type cells 601 and 602 respectively which form part of two successive rows and are located one above the other. These cells are represented in the bare state in FIG. 6. In accordance with conventional practice, the holes formed in the final oxide layer which serves to protect the circuit and providing access to the drains, to the sources and to the gates of the transistors are represented by shaded squares.

Figure 7:
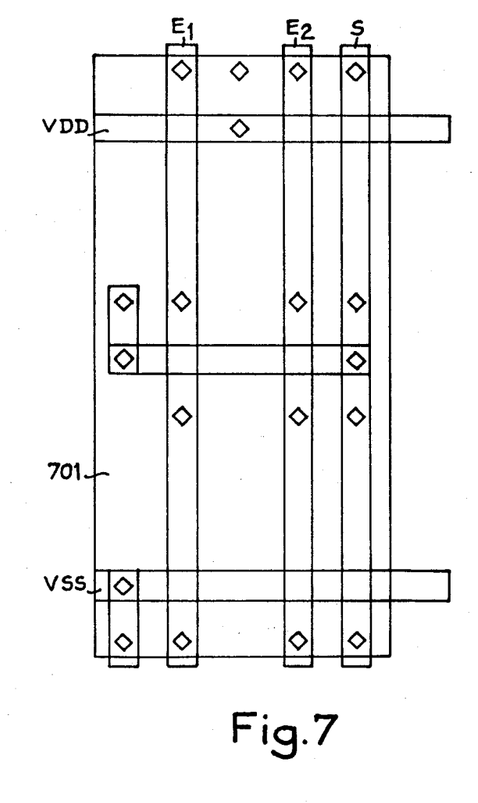
FIG. 7 is a connection diagram for constructing the gate of FIG. 5 with the cells of FIG. 6.

FIG. 7 illustrates the system of aluminum connections which makes it possible to construct the desired two-input NAND-gate from said cells. In this figure, there are shown within the frame 701 which delimits the area of the two cells horizontal connections such as the connections VDD and VSS corresponding to the two supply buses which are obtained from the initial deposition of aluminum on the oxide layer whose function is to protect the prediffused circuit. The vertical connections such as E1 and E2 provided for the two inputs and S for the output are obtained as a result of deposition of the second aluminum layer on the intermediate insulating oxide layer deposited after the first deposition of aluminum. In order to provide connections between the horizontal and vertical connections corresponding to these two layers as well as between the vertical connections of the second layer and a predetermined number of points of access to the sources, to the drains and to the gates, orifices located at the points of intersection or on the points of access to the transistors are formed in the intermediate oxide layer. These orifices are represented in the figure by lozenges in order to distinguish them from the holes providing access to the transistor electrodes. This representation is merely symbolic in both cases.

Figure 6:
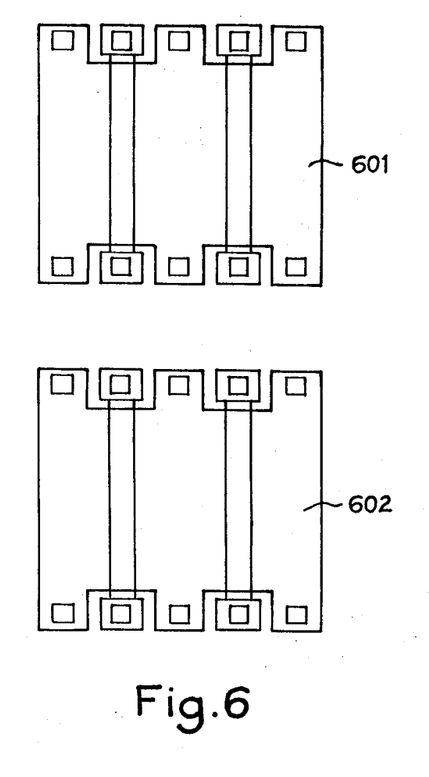
FIG. 6 is a diagram of two prediffused basic cells in accordance with the invention for constructing the gate of FIG. 5.
Figure 8:
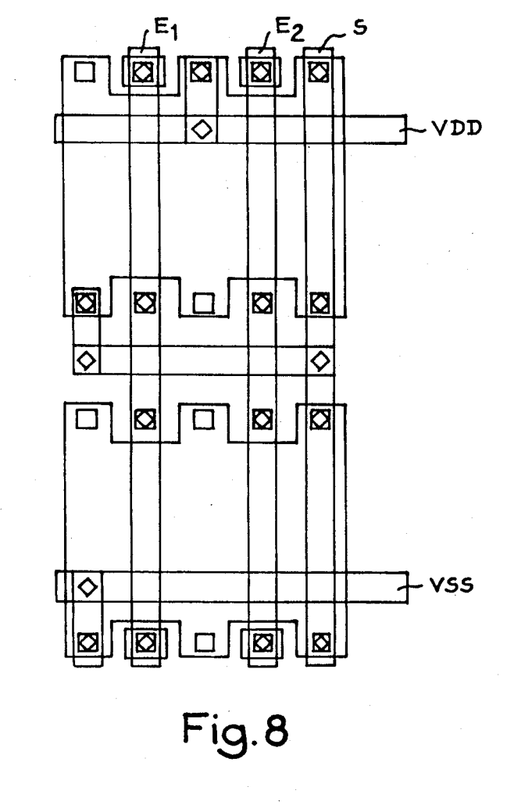
FIG. 8 is a general layout diagram in accordance with the invention and showing the gate of FIG. 5.

FIG. 7 is more readable but less understandable than the combination of FIGS. 6 and 7 which provides a complete representation of the gate herein described. For this reason, FIG. 8 shows the two FIGS. 6 and 7 in superposed relation. This figure therefore provides all the details of a two-input NAND-gate constructed by means of the method according to the invention.

Figure 9:
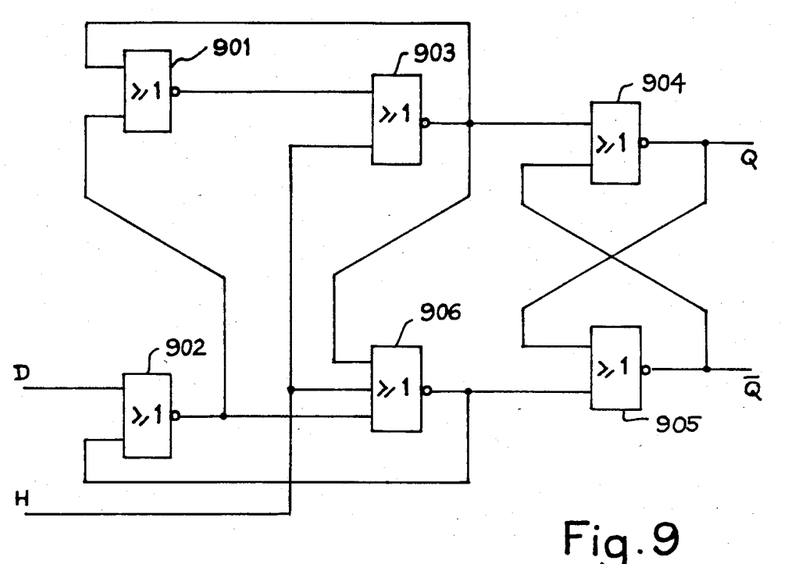
FIG. 9 is a schematic diagram of a D-type flip-flop.

FIG. 9 is a logical diagram of a static D-type flip-flop fabricated from five two-input NOR-gates 901 to 905 and from a three-input NOR-gate 906. Said flip-flop operates by means of two input signals, namely a data signal D and a clock signal H, and delivers two complementary output signals Q and $\overline{Q}$.

Figure 10:
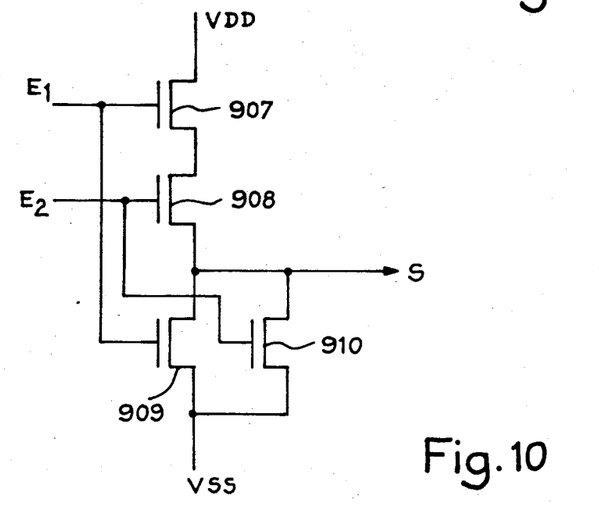
FIG. 10 is a circuit diagram of a NOR-gate employed in the layout of FIG. 9.

The electric circuit diagram of one of the two-input NOR-gates is represented in FIG. 10. This diagram is wholly complementary to the circuit diagram of FIG. 5 representing a NAND-gate. There are shown in this figure two p-type transistors 907 and 908 which are supplied in series from the source VDD and in turn supply two n-type transistors 909 and 910 connected in parallel, said transistors being connected to the supply source VSS. One of the input signals E1 is applied in parallel to the gates of the transistors 907 and 909 and the other input signal E2 is applied in parallel to the gates of the transistors 908 and 910. A three-input NOR-gate such as the gate 906 will comprise three p-type transistors in series and three n-type transistors in parallel, each gate of a p-type transistor being connected to a gate of a n-type transistor and intended to receive one of the three input signals.

Figures 11, 11A:
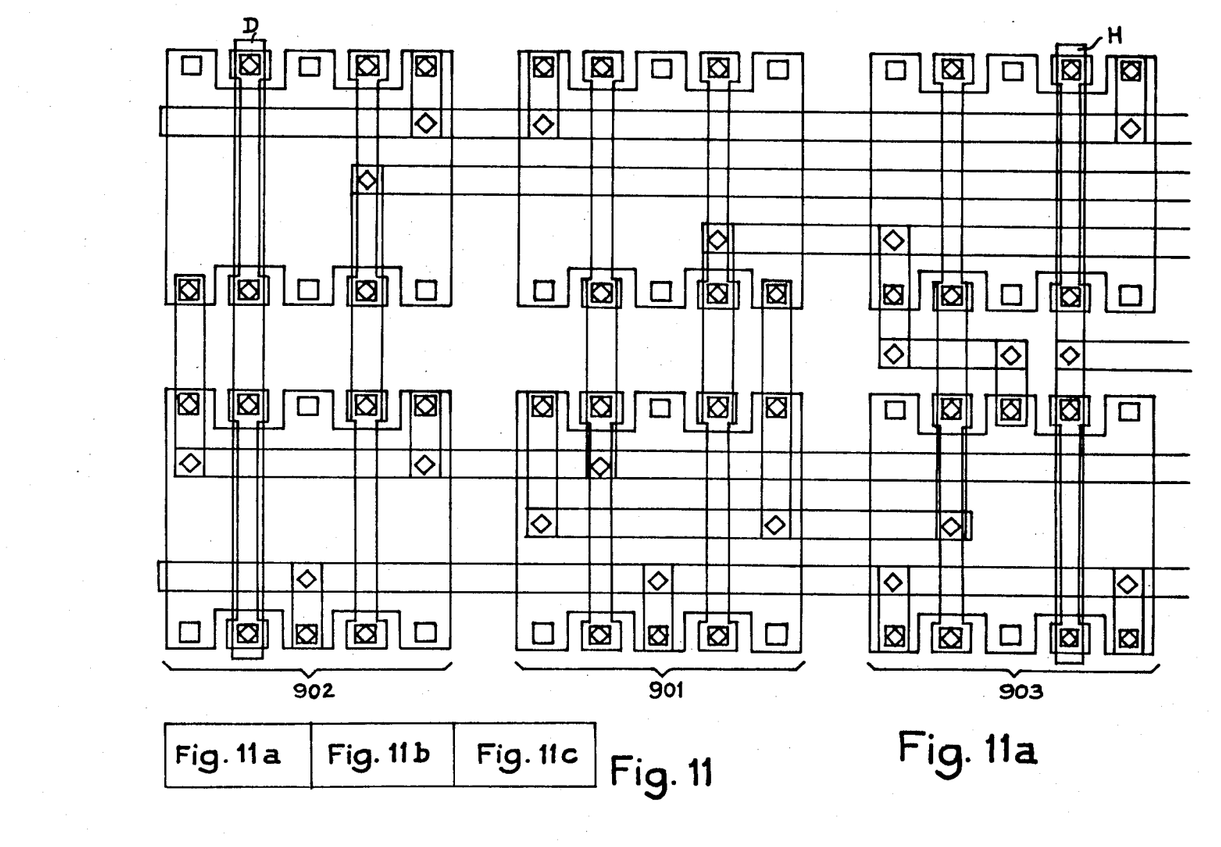
FIG. 11 is an exploded view in the form of partial figures 11a, 11b, 11c representing the general layout in accordance with the invention and showing the flip-flop of FIG. 9.
Figure 11B:
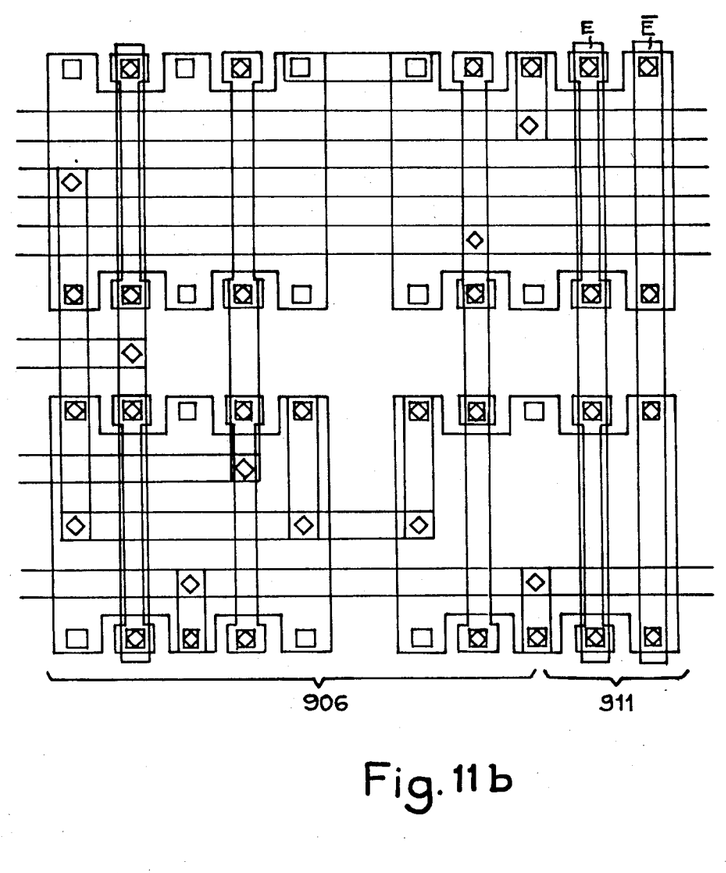
Figure 11C:
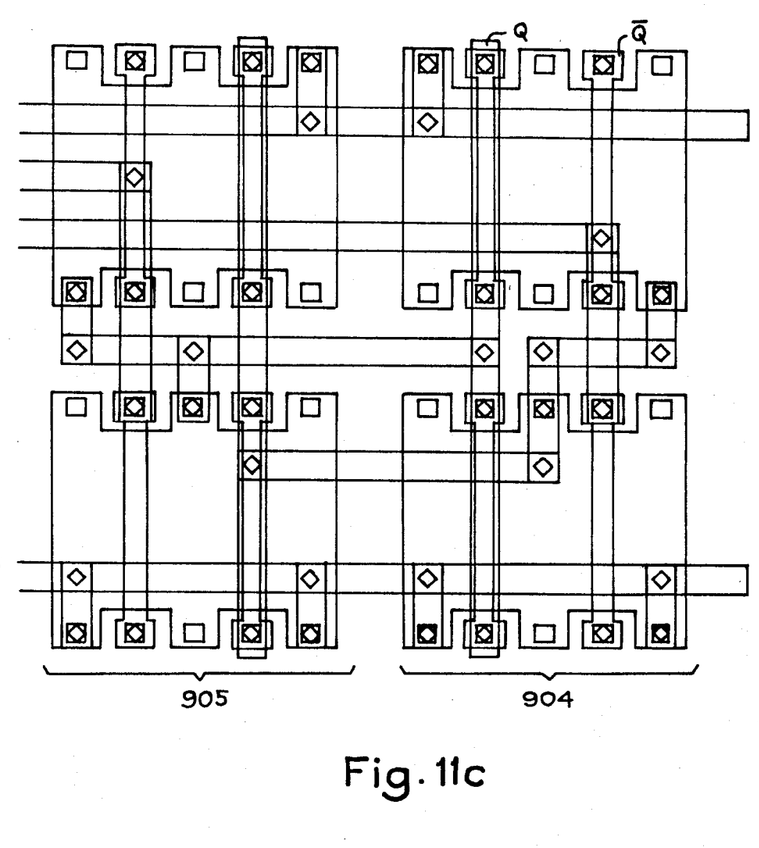

By adopting the drawing conventions explained earlier with reference to the two-input NAND-gate, the exploded view of FIG. 11 which is accordingly subdivided into three FIGS. 11a, 11b and 11c provides a complete representation showing the different superposed layers of the library circuit corresponding to the static D-type flip-flop mentioned above.

This diagram utilizes seven pairs of successive p-type and n-type basic cells forming part of two successive p-type and n-type rows. The first pair constitutes the gate 902 and receives the signal D. The second pair constitutes the gate 901. The third pair constitutes the gate 903 and receives the signal H. The gate 906 having three inputs is formed by the fourth pair and the two first p-type and n-type transistors of the fifth pair. The sixth pair constitutes the gate 905. The seventh pair forms the gate 904 and delivers the signals Q and $\bar{Q}$.

The two transistors of the fifth pair which were free have been employed for realizing an inverter which receives a signal E and delivers the signal $\bar{E}$. It is in fact always useful to provide inverters in a logic circuit and these latter are preferably mounted directly within the library circuits in order to ensure effective separation between the programs which serve to carry out wiring of the circuits from those which serve to carry out intercircuit wiring.

It is readily apparent that the complete flip-flop wiring system is contained within the rectangle defined by the seven pairs of basic cells, thus leaving provided between the basic cells of the flip-flop for the same intercircuit wiring system.

It may therefore be concluded that the method in accordance with the invention in fact achieves a synthesis between the prediffused circuit technique and the standard circuit technique. Thus standard circuits called from a library may be distributed on a prediffused substrate at will, the wiring between circuits being then carried out as in the standard circuit technique.

What is claimed is:

1. A prediffused integrated circuit, comprising a plurality of basic cells arranged in a plurality of rows on a substrate, each basic cell including two MOS transistors connected in series through a common drain/source, each transistor having a separate gate, each row having basic cells of the same type while adjacent rows alternate between p-type and N-type, each gate and drain/source for said two MOS transistors having connection points arranged in first and second horizontal rows of connection points, each horizontal row including first connection points corresponding to said drain/sources, and second connection points corresponding to said gates, said drain/sources having excrescences upon which are mounted said first connection points to cause said first connection points to be substantially aligned with said second connection points.

2. An integrated circuit according to claim 1 wherein gaps are located between (a) basic cells in each row, and (b) rows of basic cells.

3. An integrated circuit according to claim 2 further including a standard circuit capable of performing a logic function, said standard circuit including at least one basic cell from each of adjacent p-type and n-type rows.

4. An integrated circuit according to claim 3 further including longitudinal connection lines, formed between said horizontal rows in each p-type and n-type row, for interconnecting basic cells.

5. An integrated circuit according to claim 4, further including a plurality of standard circuits, and wherein at least one of said connection lines includes at least one row of basic cells which is not included in any standard circuit, said at least one connection line for interconnecting standard circuits.

* * * * *